US010128765B2

(12) United States Patent
Sun et al.

(10) Patent No.: US 10,128,765 B2
(45) Date of Patent: Nov. 13, 2018

(54) MULTI-STAGE POWER CONVERTER USING PULSE WIDTH MODULATOR TO CONVERT SAMPLED SECOND-STAGE POWER PARAMETERS INTO DIGITAL PULSE WIDTH MODULATION SIGNALS AND CONTROL METHOD THEREOF

(71) Applicant: DELTA ELECTRONICS, INC., Taoyuan (TW)

(72) Inventors: Hao Sun, Shanghai (CN); Yueyong Meng, Shanghai (CN); Lei Chang, Shanghai (CN); Jinfa Zhang, Shanghai (CN)

(73) Assignee: DELTA ELECTRONICS, INC., Taoyuan (TW)

( * ) Notice: Subject to any disclaimer, the term of this patent is extended or adjusted under 35 U.S.C. 154(b) by 0 days.

(21) Appl. No.: 15/490,144

(22) Filed: Apr. 18, 2017

(65) Prior Publication Data
US 2018/0131279 A1    May 10, 2018

(30) Foreign Application Priority Data
Nov. 7, 2016    (CN) .......................... 2016 1 0974916

(51) Int. Cl.
*H02M 3/335*    (2006.01)
*H03K 7/08*    (2006.01)
(Continued)

(52) U.S. Cl.
CPC ... *H02M 3/33523* (2013.01); *H02M 3/33515* (2013.01); *H02M 2001/007* (2013.01);
(Continued)

(58) Field of Classification Search
CPC ............................................ H02M 3/335–3/42
See application file for complete search history.

(56) References Cited

U.S. PATENT DOCUMENTS

2005/0271149 A1   12/2005  Dupuis
2008/0191685 A1   8/2008   Dhuyvetter et al.
(Continued)

FOREIGN PATENT DOCUMENTS

CN    101238634 A    8/2008
CN    103036396 A    4/2013
(Continued)

*Primary Examiner* — Kyle J Moody
*Assistant Examiner* — Peter Novak
(74) *Attorney, Agent, or Firm* — Kirton McConkie; Evan R. Witt

(57) ABSTRACT

A multi-stage power converter includes a first-stage power conversion circuit, a second-stage power conversion circuit, a second-stage analogic sampler, a pulse width modulator, a first isolator, a pulse width analyzer and a control unit. The second-stage analogic sampler samples power parameter from the second-stage power conversion circuit. The pulse width modulator converts the power parameter into a pulse width modulation signal. The pulse width analyzer receives the pulse width modulation signal through the first isolator in an isolation manner, calculates a duty ratio of the pulse width modulation signal according to a rising edge and a falling edge of the pulse width modulation signal, and calculates the power parameter according to the duty ratio. The control unit controls operations of the second-stage power conversion circuit according to the power parameter that is obtained by the pulse width analyzer.

27 Claims, 9 Drawing Sheets

(51) Int. Cl.
   *H03K 9/08*    (2006.01)
   *H02M 1/00*    (2006.01)
   *H03K 5/1534*  (2006.01)

(52) U.S. Cl.
   CPC ............. *H03K 5/1534* (2013.01); *H03K 7/08* (2013.01); *H03K 9/08* (2013.01)

(56) References Cited

U.S. PATENT DOCUMENTS

| | | |
|---|---|---|
| 2014/0328427 A1 | 11/2014 | Chang et al. |
| 2016/0250934 A1* | 9/2016 | Yuasa ................... H01F 38/14 307/104 |
| 2017/0025961 A1* | 1/2017 | Seeman ................ H02M 1/08 |
| 2017/0126064 A1* | 5/2017 | Lee ........................ H02J 50/12 |
| 2017/0214322 A1* | 7/2017 | Lin ................... H02M 3/33576 |

FOREIGN PATENT DOCUMENTS

| | | |
|---|---|---|
| CN | 204068706 U | 12/2014 |
| TW | 201547174 A | 12/2015 |

\* cited by examiner

MULTI-STAGE POWER CONVERTER USING PULSE WIDTH MODULATOR TO CONVERT SAMPLED SECOND-STAGE POWER PARAMETERS INTO DIGITAL PULSE WIDTH MODULATION SIGNALS AND CONTROL METHOD THEREOF

CROSS-REFERENCE TO RELATED APPLICATION

This application claims priority to China Patent Application No. 201610974916.6, filed on Nov. 7, 2016, the entire contents of which are incorporated herein by reference for all purposes.

FIELD OF THE DISCLOSURE

The present disclosure relates to a power converter and a control method, and more particularly to an isolated multi-stage power converter and a control method.

BACKGROUND OF THE DISCLOSURE

Recently, most switching power supply apparatuses are controlled in a digital manner, so that the complicated algorithm can be realized more easily, and more kinds of electronic products can be realized. In addition, the digital control mechanism can provide more flexible control interface to the digital power devices.

As known, a multi-stage power converter has a complicated circuit structure. If the multi-stage power converter is controlled in the digital manner, many benefits can be achieved. Conventionally, the multi-stage power converter comprises plural power conversion circuits, and the plural power conversion circuits are isolated through a transformer. Moreover, each power conversion circuit is controlled according to a closed-loop control mechanism. Consequently, the location of the control unit becomes an important issue.

Conventionally, there are many approaches to locate the control units. In accordance with one approach, each stage of the multi-stage power converter comprises an individual control unit to perform the closed-loop control operation of each stage. In accordance with another approach, a main control unit is used for performing the closed-loop control operations of all stages. Moreover, the feedback signals from different isolated sides of the main control unit are transmitted to the main control unit through a conventional communication method. In accordance with a third approach, a main control unit is used for performing the closed-loop control operations of all stages. In addition, the feedback signals from different isolated sides of the main control unit are transmitted to the main control unit through a linear optocoupler.

However, the above approaches have some drawbacks. For example, the first approach increases the circuit complexity. Moreover, the uses of plural control units increase the debugging complexity. The second approach uses the conventional communication method (e.g., I2C, CAN or SPI) to transmit the feedback signals to the main control unit. Consequently, the balance between the communication speed and the hardware resource should be taken into consideration. However, information is transmission in a form of a frame. Each frame contains a lot of meaningless information for the control operation. For effectively transmitting information at a desired speed, the working speed of the hardware components should be largely increased. That is, the main control unit used in the multi-stage power converter needs to have enhanced computing capability. Since the main control unit is costly, the fabricating cost of the multi-stage power converter is increased. The third approach uses the linear optocoupler to transmit the feedback signals to the main control unit. However, the linear optocoupler has many problems such as a temperature drift effect and an aging problem. Under this circumstance, the operations of the multi-stage power converter are possibly abnormal.

Therefore, there is a need of providing an improved multi-stage power converter and a control method of the multi-stage power converter in order to overcome the above drawbacks.

SUMMARY OF THE DISCLOSURE

The present disclosure provides a multi-stage power converter with simplified circuit structure, cost-effectiveness and reduced debugging complexity.

The present disclosure also provides a control method of the multi-stage power converter.

In accordance with an aspect of the present disclosure, there is provided a multi-stage power converter. The multi-stage power converter includes a first-stage power conversion circuit, a second-stage power conversion circuit, a second-stage analogic sampler, a pulse width modulator, a first isolator, a pulse width analyzer and a control unit. The second-stage power conversion circuit includes a transformer, a primary side circuit and a secondary side circuit. The primary side circuit is connected between the first-stage power conversion circuit and a primary winding of the transformer. The secondary side circuit is connected with a secondary winding of the transformer. The second-stage analogic sampler is connected with the secondary side circuit for sampling at least one second-stage power parameter from the secondary side circuit. The pulse width modulator receives a sampling result from the second-stage analogic sampler and converts the at least one second-stage power parameter into at least one pulse width modulation signal with at least one corresponding duty ratio. The first isolator is connected with the pulse width modulator for receiving the at least one pulse width modulation signal. The pulse width analyzer is connected with the first isolator. The pulse width analyzer receives the at least one pulse width modulation signal through the first isolator in an isolation manner, calculates the duty ratio of the at least one pulse width modulation signal according to a rising edge and a falling edge of the at least one pulse width modulation signal, and calculates the at least one second-stage power parameter according to the duty ratio. The control unit is connected with the first-stage power conversion circuit, the primary side circuit and the pulse width analyzer. The control unit controls operations of the first-stage power conversion circuit, and controls operations of the primary side circuit according to the at least one second-stage power parameter that is obtained by the pulse width analyzer.

In accordance with another aspect of the present disclosure, there is provided a control method of a multi-stage power converter. The multi-stage power converter includes a first-stage power conversion circuit, a second-stage power conversion circuit, a second-stage analogic sampler, a pulse width modulator, a first isolator, a pulse width analyzer and a control unit. The second-stage power conversion circuit is connected with an output terminal of the first-stage power conversion circuit and includes a transformer. The control method includes the following steps. Firstly, at least one second-stage power parameter is sampled from the second-stage power conversion circuit by the second-stage analogic sampler. Then, the at least one second-stage power parameter is converted into at least one pulse width modulation signal with a corresponding duty ratio by the pulse width modulator. Then, the at least one pulse width modulation signal is transmitted from the first isolator to the pulse width analyzer in an isolation manner. Then, the pulse width analyzer calculates the duty ratio of the at least one pulse width modulation signal according to a rising edge and a falling edge of the at least one pulse width modulation signal and calculates the at least one second-stage power parameter according to the duty cycle. The control unit performs a computation according to the at least one second-stage power parameter from the pulse width analyzer and controls the operations of the second-stage power conversion circuit according to a result of the computation.

The above contents of the present disclosure will become more readily apparent to those ordinarily skilled in the art after reviewing the following detailed description and accompanying drawings, in which:

DETAILED DESCRIPTION OF THE PREFERRED EMBODIMENT

The present disclosure will now be described more specifically with reference to the following embodiments. It is to be noted that the following descriptions of preferred embodiments of this disclosure are presented herein for purpose of illustration and description only. It is not intended to be exhaustive or to be limited to the precise form disclosed.

Figure 1:
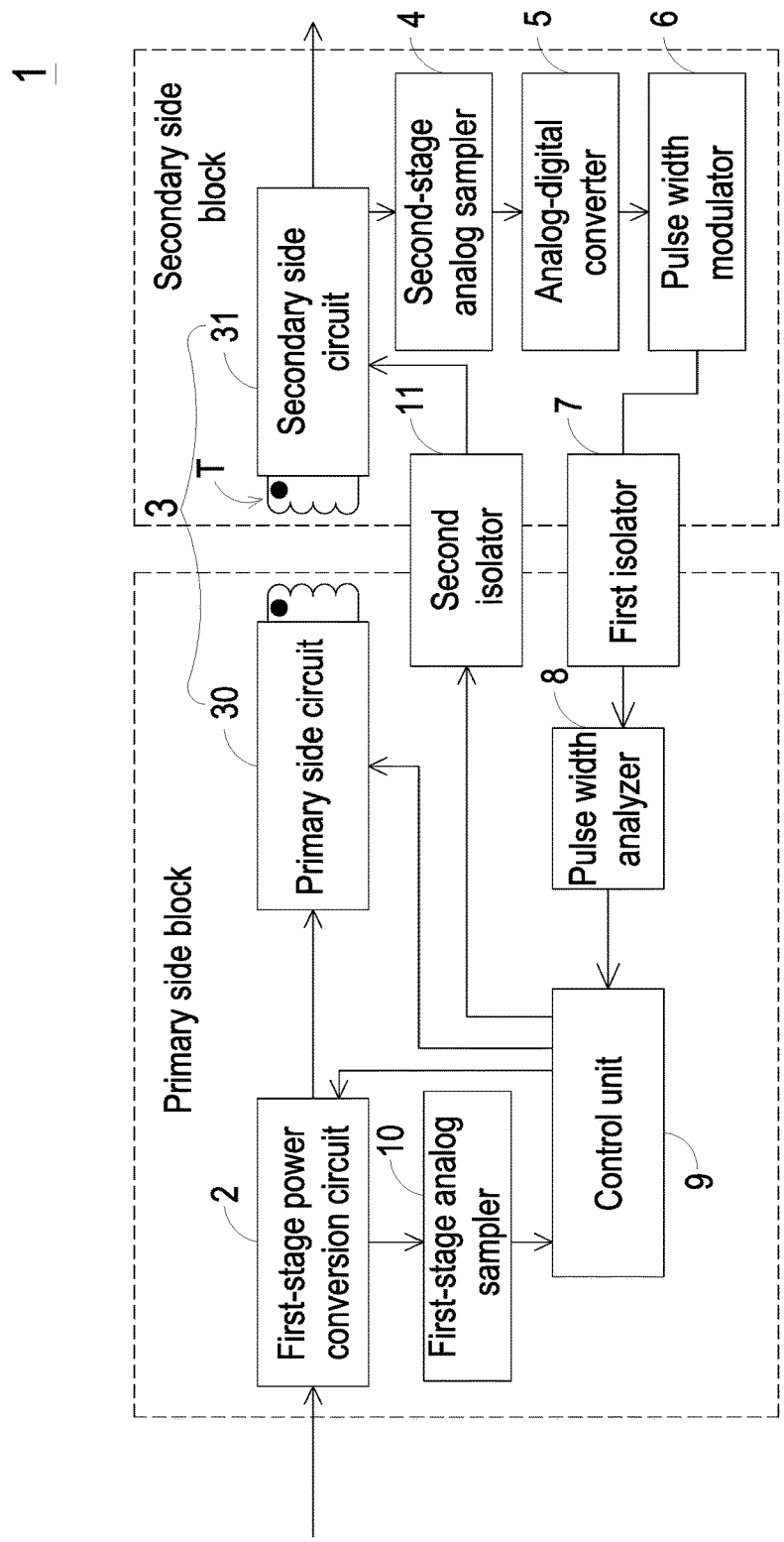
FIG. 1 is a schematic circuit block diagram illustrating the architecture of a multi-stage power converter according to an embodiment of the present disclosure.

FIG. 1 is a schematic circuit block diagram illustrating the architecture of a multi-stage power converter according to an embodiment of the present disclosure. The multi-stage power converter 1 can be applied to a vehicle charging system. The multi-stage power converter 1 is used for converting a received input power to a load (not shown). For example, the load is a battery used in an electric vehicle. The multi-stage power converter 1 comprises plural power conversion circuits in multiple stages. For clarification, a two-stage power converter is taken as an example of the multi-stage power converter 1.

As shown in FIG. 1, the multi-stage power converter 1 comprises a first-stage power conversion circuit 2, a second-stage power conversion circuit 3, a second-stage analogic sampler 4, an analog-digital converter 5, a pulse width modulator 6, a first isolator 7, a pulse width analyzer 8 and a control unit 9. An example of the first-stage power conversion circuit 2 includes but is not limited to a power factor correction circuit. The first-stage power conversion circuit 2 is used for converting input power (e.g., AC power) into first DC power while performing power factor correction.

An example of the second-stage power conversion circuit 3 includes but is not limited to a DC-to-DC converter. The second-stage power conversion circuit 3 is connected with the output terminal of the first-stage power conversion circuit 2. By the second-stage power conversion circuit 3, the first DC power is converted into second DC power. The second DC power is outputted to a load (not shown). The second-stage power conversion circuit 3 comprises a primary side circuit 30, a transformer T and a secondary side circuit 31. The primary side circuit 30 is connected between the first-stage power conversion circuit 2 and a primary winding of the transformer T. Moreover, the primary side circuit 30 comprises a first switching circuit (not shown). According to the operation of the first switching circuit, the first DC power is adjusted. The adjusted first DC power is transmitted from the primary side circuit 30 to the primary winding of a transformer T. Due to the electromagnetic coupling between the primary winding and the secondary winding of the transformer T, transient AC power is generated in the secondary winding of the transformer T. The secondary side circuit 31 is connected with the secondary winding of the transformer T. Moreover, the secondary side circuit 31 comprises a second switching circuit (not shown). According to the operation of the second switching circuit, the transient AC power is adjusted and the adjusted transient AC power is rectified and filtered to output second DC power.

The second-stage analogic sampler 4 is connected with the secondary side circuit 31 for sampling at least one second-stage power parameter from the secondary side circuit 31. For example, the at least one second-stage power parameter contains the voltage of the second DC power, the current of the second DC power and/or the temperature of the secondary side circuit 31. The analog-digital converter 5 is connected between the second-stage analogic sampler 4 and the pulse width modulator 6. The analog-digital converter 5 is used for converting the at least one sampled second-stage power parameter (i.e., an analog signal) of the second-stage analogic sampler 4 into a digital signal. The digital signal is provided to the pulse width modulator 6.

The pulse width modulator 6 is connected with the analog-digital converter 5 to receive the digital signal from the analog-digital converter 5. Moreover, the pulse width modulator 6 converts the at least one second-stage power parameter (i.e., the digital signal) into at least one pulse width modulation signal with a corresponding duty ratio. Preferably but not exclusively, the frequency of the pulse width modulation signal is equal to the control frequency of the multi-stage power converter 1.

In some embodiments, the analog-digital converter 5 is omitted. If the analog-digital converter 5 is omitted, the pulse width modulator 6 is directly connected with the second-stage analogic sampler 4. In addition, the at least one sampled second-stage power parameter of the second-stage analogic sampler 4 is directly converted into at least one pulse width modulation signal with a corresponding duty ratio by the pulse width modulator 6.

The first isolator 7 is connected between the pulse width analyzer 8 and the pulse width modulator 6. The first isolator 7 receives the at least one pulse width modulation signal from the pulse width modulator 6 and transmits the at least one pulse width modulation signal to the pulse width analyzer 8 in an isolation manner.

The pulse width analyzer 8 is connected with the first isolator 7. Moreover, the pulse width analyzer 8 receives the at least one pulse width modulation signal through the first isolator 7 in an isolation manner, and calculates the duty ratio of the at least one pulse width modulation signal according to a rising edge and a falling edge of the at least one pulse width modulation signal. According to the duty ratio, the pulse width analyzer 8 calculates the at least one second-stage power parameter.

The control unit 9 is connected with the first-stage power conversion circuit 2, the primary side circuit 30 and the pulse width analyzer 8. The control unit 9 controls operations of the first-stage power conversion circuit 2. Moreover, the control unit 9 performs a closed-loop computation according to the at least one second-stage power parameter that is obtained by the pulse width analyzer 8. According to the result of the closed-loop computation, the control unit 9 outputs a corresponding control signal to control the first switching circuit of the primary side circuit 30. Consequently, the first DC power to be received by the primary side circuit 30 is adjusted.

As mentioned above, the second-stage power conversion circuit 3 comprises the transformer T. Consequently, the primary side circuit 30 and the secondary side circuit 31 are isolated from each other through the transformer T. Under this circumstance, the multi-stage power converter 1 is divided into a primary side block and a secondary side block, which are isolated from each other. The primary side block comprises the first-stage power conversion circuit 2, the primary side circuit 30 of the second-stage power conversion circuit 3, the pulse width analyzer 8 and the control unit 9. The secondary side block comprises the secondary side circuit 31 of the second-stage power conversion circuit 3, the second-stage analogic sampler 4, the analog-digital converter 5 and the pulse width modulator 6.

The multi-stage power converter 1 further comprises a first-stage analogic sampler 10. The first-stage analogic sampler 10 is included in the primary side block and connected with the first-stage power conversion circuit 2 and the control unit 9. The first-stage analogic sampler 10 is used for sampling at least one first-stage power parameter from the first-stage power conversion circuit 2. For example, the at least one first-stage power parameter contains the voltage of the input power, the current of the input power, the voltage of the DC bus and/or a protection signal. The sampling result is transmitted to the control unit 9. According to the at least one first-stage power parameter, the control unit 9 performs a closed-loop computation. According to the result of the closed-loop computation, the control unit 9 controls the operations of the first-stage power conversion circuit 2. Consequently, the power factor of the input power is corrected, the DC bus voltage is stabilized, and the voltage level of the first DC power is adjusted.

Optionally, the multi-stage power converter 1 further comprises a second isolator 11. The second isolator 11 is connected between the control unit 9 and the secondary side circuit 31 of the second-stage power conversion circuit 3. Similarly, the control unit 9 performs the closed-loop computation according to the at least one second-stage power parameter from the pulse width analyzer 8, and issues a corresponding control signal to the secondary side circuit 31. Especially, the control signal is transmitted from the control unit 9 to the secondary side circuit 31 through the second isolator 11. According to the control signal, the operations of the secondary side circuit 31 are controlled, and the voltage level of the second DC power is adjusted.

The detailed circuitry of the multi-stage power converter 1 will be described as follows. For clarification, the at least one second-stage power parameter of the secondary side circuit 31 sampled by the second-stage analogic sampler 4 includes two second-stage power parameters. Correspondingly, the two second-stage power parameters are converted into two pulse width modulation signals with the corresponding duty ratios by the pulse width modulator 6.

Figure 2:
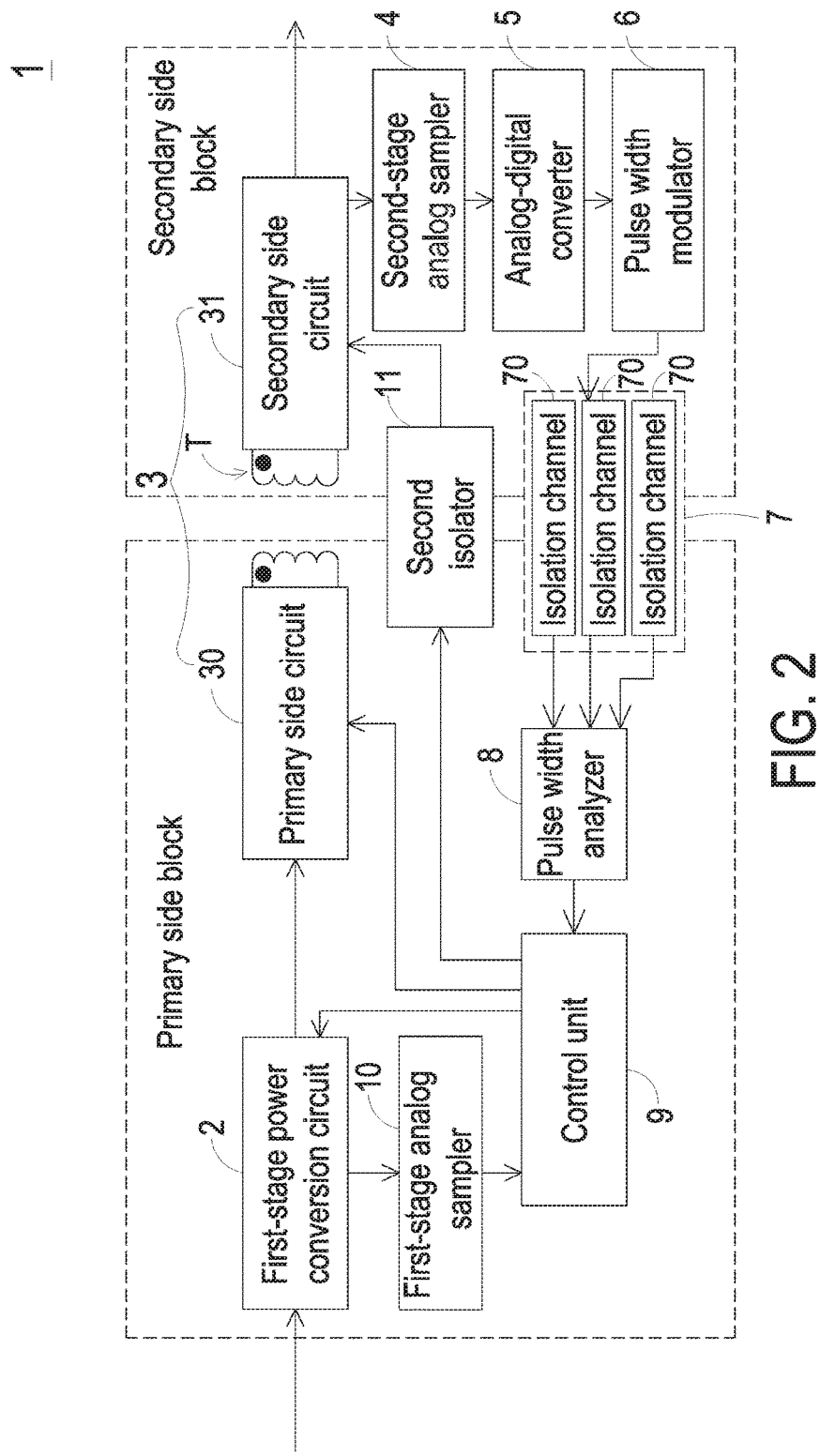
FIG. 2 is a schematic circuit block diagram illustrating an example of the first isolator and a portion of the multi-stage power converter of FIG. 1.

FIG. 2 is a schematic circuit block diagram illustrating an example of the first isolator and a portion of the multi-stage power converter of FIG. 1. In this embodiment, the pulse width modulator 6 can generate plural independent pulse width modulation signals. As shown in FIG. 2, the first isolator 7 comprises plural isolation channels 70. Each isolation channel 70 is connected between the pulse width modulator 6 and the pulse width analyzer 8. The plural pulse width modulation signals are transmitted from the pulse width modulator 6 to the pulse width analyzer 8 through the corresponding isolation channels 70.

In an embodiment, the pulse width modulator 6 is a fixed-frequency pulse width modulator. That is, the frequency of the pulse width modulation signal from the pulse width modulator 6 is fixed. In another embodiment, the pulse width modulator 6 is a variable-frequency pulse width modulator. That is, the frequency of the pulse width modulation signal is variable according to the practical requirements of the multi-stage power converter 1. Consequently, the frequency of the pulse width modulation signal may be different under different working conditions of the multi-stage power converter 1.

Figure 3:
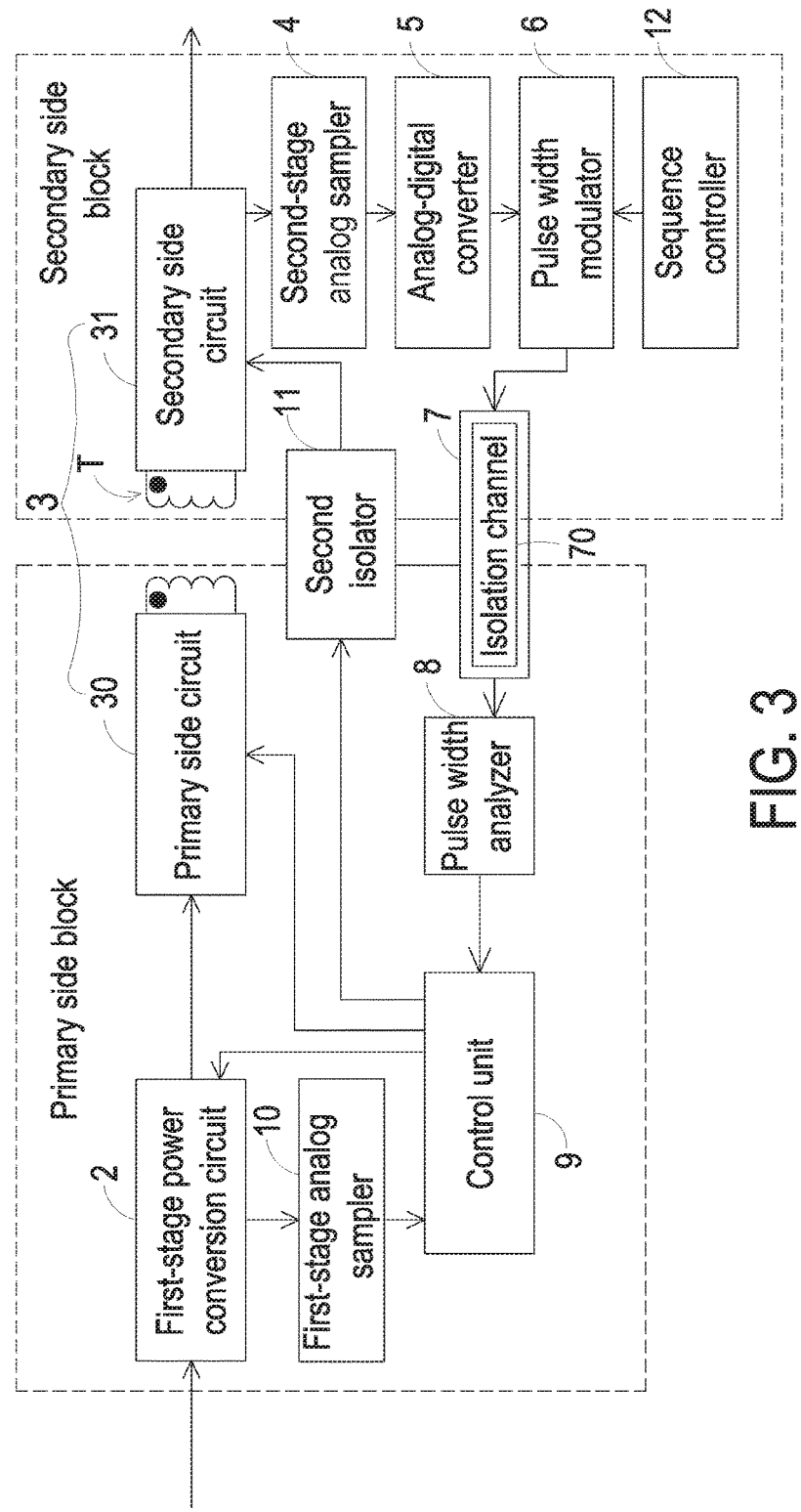
FIG. 3 is a schematic circuit block diagram illustrating another example of the first isolator and a portion of the multi-stage power converter of FIG. 1.

FIG. 3 is a schematic circuit block diagram illustrating another example of the first isolator and a portion of the multi-stage power converter of FIG. 1. In this embodiment, the at least one second-stage power parameter sampled by the second-stage analogic sampler 4 includes plural second-stage power parameters, and the at least one pulse width modulation signal obtained by the pulse width modulator 6 includes plural pulse width modulation signals with the corresponding duty ratios. The plural pulse width modulation signals are generated in a time division manner. That is, each pulse width modulation signal from the pulse width modulator 6 is correlated with one corresponding second-stage power parameter. Moreover, the pulse width modulator 6 provides pulse width modulation signals corresponding to different second-stage power parameters according to the systematic requirement. In this embodiment, the first isolator 7 comprises a single isolation channel 70. Correspondingly, the multi-stage power converter 1 further comprises a sequence controller 12. The sequence controller 12 is connected with the pulse width modulator 6. Under control of the sequence controller 12, the plural pulse width modulation signals from the pulse width modulator 6 are transmitted to the pulse width analyzer 8 through the isolation channel 70 in a time-interleaving manner. That is, the sequence controller 12 controls the sequences, the time and the frequencies of the plural pulse width modulation signals.

In an embodiment, the pulse width modulator 6 is a time-sharing variable-frequency pulse width modulator. Under this circumstance, the cycle numbers of the pulse width modulation signals from the pulse width modulator 6 are fixed or variable, and the pulse width modulation signals with different frequencies are transmitted from the pulse width modulator 6 to the single isolation channel in a time division manner under sequence or a random manner under control of the sequence controller 12. In each time segment, a pulse width modulation signal with a specified frequency is transmitted from the pulse width modulator 6 to the isolation channel 70. That is, in different time segments, the pulse width modulation signals with different frequencies are transmitted from the pulse width modulator 6 to the pulse width analyzer 8 through the isolation channel 70.

Figure 4:
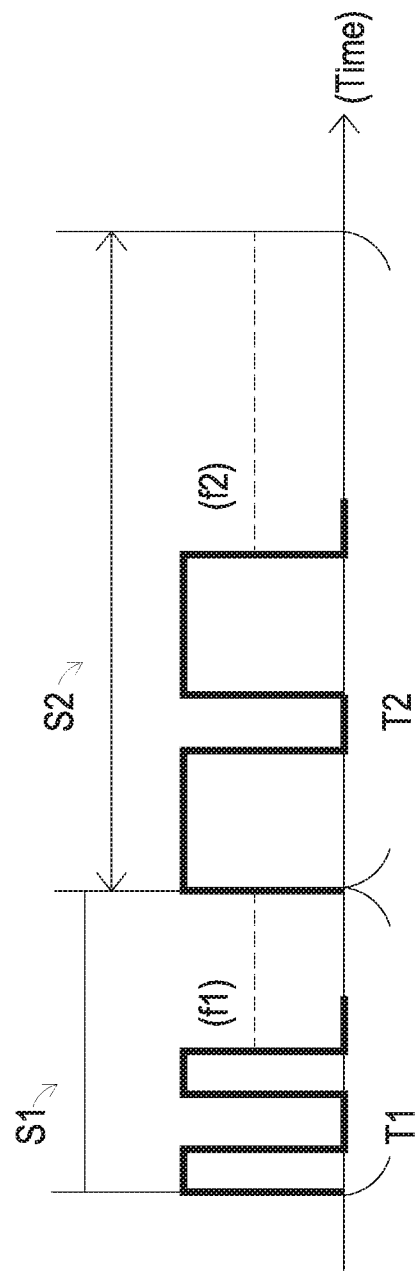
FIG. 4 is a schematic timing waveform diagram illustrating plural pulse width modulation signals with different frequencies to be transmitted from the pulse width modulator to the single isolation channel in a time-interleaving manner.

A process of transmitting plural pulse width modulation signals from the pulse width modulator 6 to the single isolation channel 70 in a time-interleaving manner will be described as follows. FIG. 4 is a schematic timing waveform diagram illustrating plural pulse width modulation signals with different frequencies to be transmitted from the pulse width modulator to the single isolation channel in a time-interleaving manner. Please refer to FIGS. 3 and 4. In case that the pulse width modulator 6 is a time-sharing variable-frequency pulse width modulator, the method of transmitting the two pulse width modulation signals to the single isolation channel 70 in the time-interleaving manner is determined according to the systematic requirement. In an embodiment, the time-sharing method is determined according to the control frequencies of the second-stage power parameters corresponding to plural pulse width modulation signals. For example, in case that the control frequency of the second-stage power parameter is higher, the occupied time segment of transmitting the corresponding plural pulse width modulation signal is longer. Consequently, the second-stage power parameter can be updated at a high speed with low time-delay. In case that the control frequency of the second-stage power parameter is lower, the occupied time segment of transmitting the corresponding plural pulse width modulation signal is shorter.

Please refer to FIG. 4 again. The pulse width modulator 6 generates two pulse width modulation signals S1 and S2. The frequency of the pulse width modulation signal S1 is f1. The frequency of the pulse width modulation signal S2 is f2. The frequency f1 and the frequency f2 are different. Consequently, the pulse width modulation signals S1 and S2 can be distinguished according to the frequencies. As shown in FIG. 4, the occupied time segment T2 of the pulse width modulation signal S2 is longer, and the occupied time segment T1 of the pulse width modulation signal S1 is shorter. Consequently, the second-stage power parameter corresponding to the pulse width modulation signal S2 can be updated at a high speed with low time-delay. Since the control frequency of the second-stage power parameter corresponding to the pulse width modulation signal S1 is lower, the second-stage power parameter is updated at a lower rate. By using the multi-stage power converter 1 of the present disclosure, the hardware resource is saved. Moreover, the cycle numbers of the plural pulse width modulation signal may be fixed or variable. In addition, the lengths of the time segments of transmitting the pulse width modulation signals may be identical or different.

Figure 5:
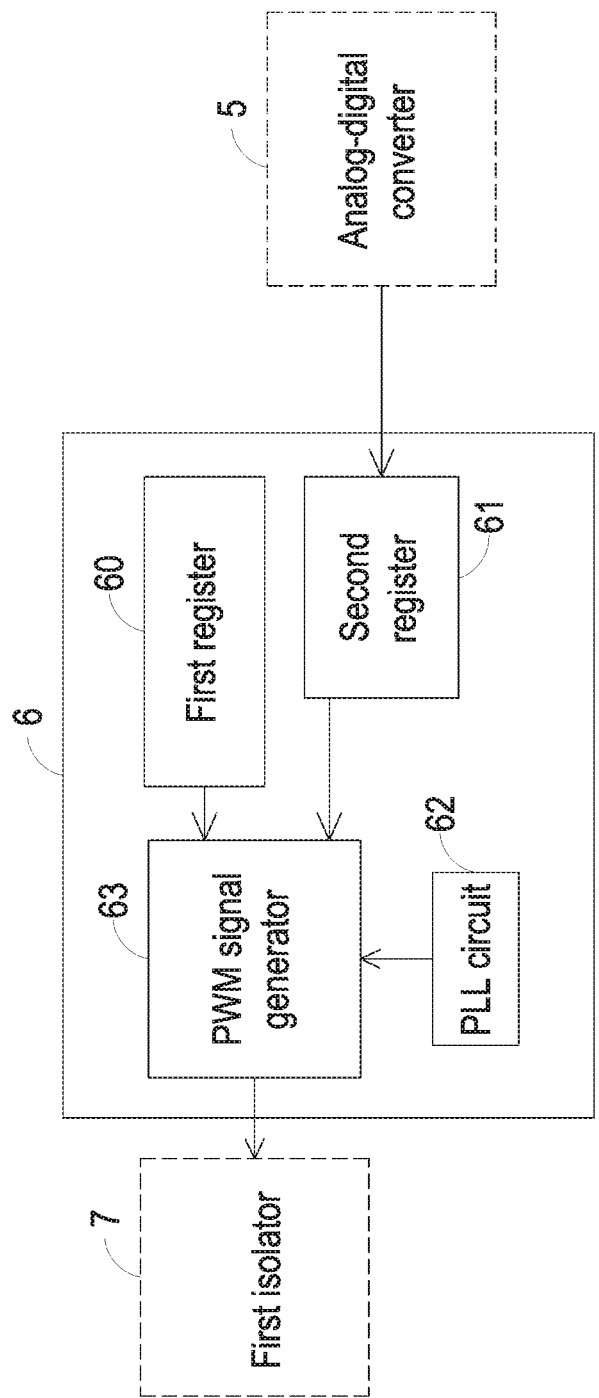
FIG. 5 is a schematic block circuit diagram illustrating the internal circuitry of the pulse width modulator in the multi-stage power converter of the present disclosure.

FIG. 5 is a schematic block circuit diagram illustrating the internal circuitry of the pulse width modulator in the multi-stage power converter of the present disclosure. As shown in FIG. 5, the pulse width modulator 6 comprises a first register 60, a second register 61, a phase-locked loop (PLL) circuit 62 and a pulse width modulation (PWM) signal generator 63. The first register 60 stores a preset cycle value. The second register 61 is connected with the analog-digital converter 5. The second register 61 stores the digital second-stage power parameters (i.e., the digital signals). The phase-locked loop circuit 62 outputs a clock signal with a first clock frequency to the pulse width modulation signal generator 63. The first clock frequency may be adjusted according to the practical requirements in order to achieve a required counting speed. The pulse width modulation signal generator 63 is connected with the first register 60, the second register 61, the phase-locked loop circuit 62 and the first isolator 7. The operating principle of the pulse width modulation signal generator 63 is counting and comparing. According to the first clock frequency of the clock signal, the counter of the pulse width modulation signal generator 63 starts counting. Moreover, a count value of the counter of the pulse width modulation signal generator 63 and the digital second-stage power parameter in the second register 61 are compared with each other. According to the comparing result, the pulse width modulation signal generator 63 generates the pulse width modulation signal in a high level or a low level. For example, if the digital second-stage power parameter in the second register 61 is higher than the count value, the pulse width modulation signal is in the high level. The maximum count value of the counter of the pulse width modulation signal generator 63 is limited by the preset cycle value of the first register 60. That is, the maximum count value of the counter of the pulse width modulation signal generator 63 is not greater than the preset cycle value of the first register 60. When the count value of the counter reaches the preset cycle value of the first register 60, the count value of the counter is zeroed. Moreover, the pulse width modulation signal generator 63 receives the stored results of the first register 60 and the second register 61. According to the first clock frequency of the clock signal, the count value is counted up by 1 from zero to the preset cycle value. According to the result of comparing the second-stage power parameter of second register 61 and the current count value, the pulse width modulation signal generator 63 generates the corresponding pulse width modulation signal to the first isolator 7. Moreover, by adjusting the first clock frequency of the clock signal from the phase-locked loop circuit 62, the frequency of the pulse width modulation signal from the pulse width modulation signal generator 63 is adjustable. According to a preset command, the multiple of the first clock frequency with respect to the system clock frequency is adjusted. Consequently, the frequency of the first clock frequency is changed.

Figure 6:
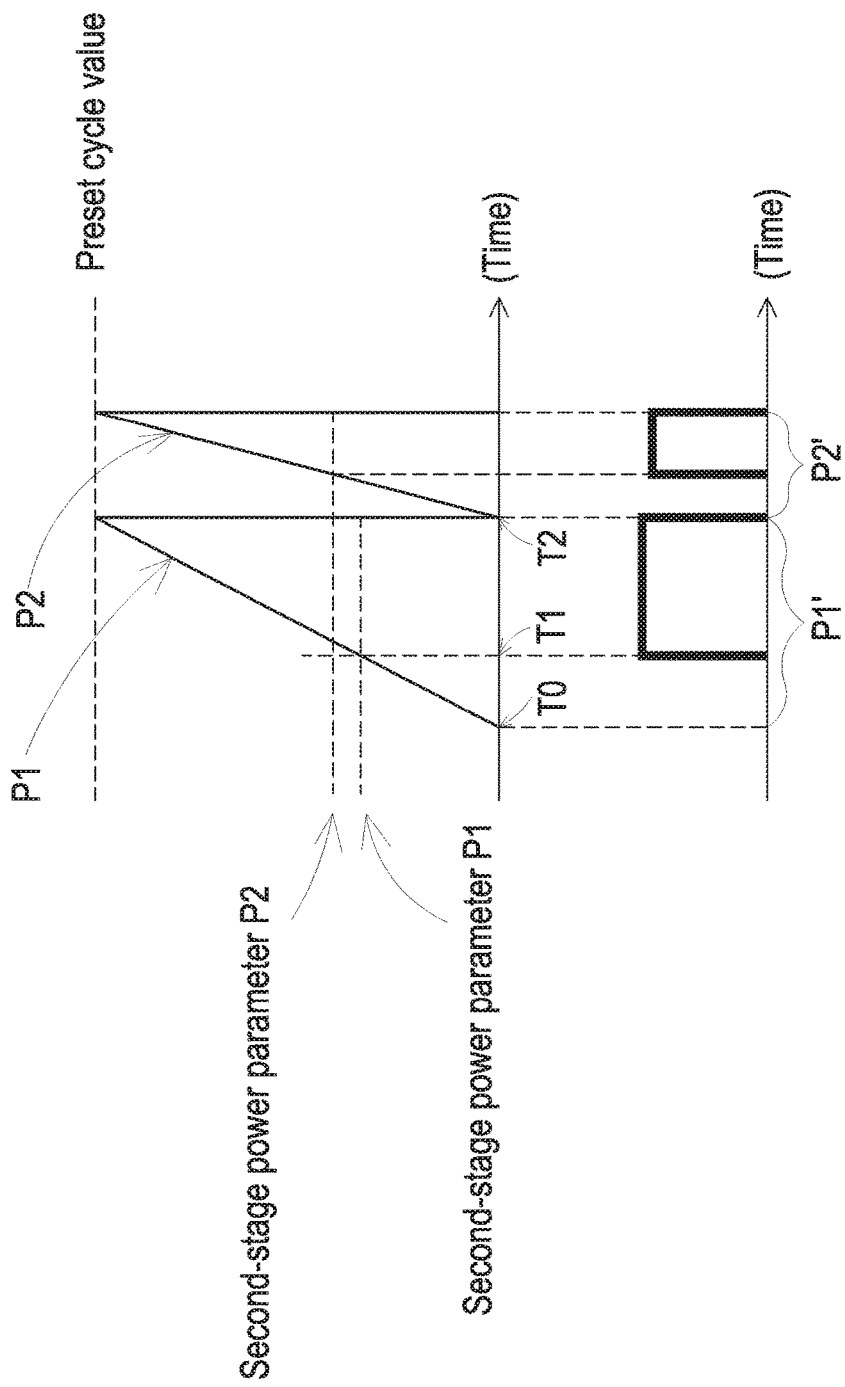
FIG. 6 is a schematic timing waveform diagram illustrating the process of generating the pulse width modulation signal by the pulse width modulator as shown in FIG. 5.

A method of transmitting different signals in the time-sharing variable-frequency manner will be described as follow. FIG. 6 is a schematic timing waveform diagram illustrating a process of generating the pulse width modulation signal by the pulse width modulator as shown in FIG. 5. As shown in FIG. 6, two second-stage power parameters P1 and P2 of the secondary side circuit 31 are sampled by the second-stage analogic sampler 4. In this embodiment, the pulse width modulator 6 is a time-sharing variable-frequency pulse width modulator. In the first time segment between the time point T0 and the time point T2, the second-stage power parameter P1 is processed by the pulse width modulator 6. In the first time segment, the count value is counted up from zero to the preset cycle value. In the time interval between T0 and T1, the count value is lower than the second-stage power parameter P1. Meanwhile, the pulse width modulation signal P1' outputted from the pulse width modulator 6 is in the low level state. In the time interval between T1 and T2, the count value is higher than or equal to the second-stage power parameter P1. Meanwhile, the pulse width modulation signal P1' outputted from the pulse width modulator 6 is in the high level state. At the time point T2, the count value is equal to the preset cycle number. Meanwhile, the count value is zeroed. In the second time segment, the second-stage power parameter P2 is processed by the pulse width modulator 6. Moreover, the counting clock may be adjusted by the phase-locked loop circuit 62 according to the practical requirements in order to achieve a required counting speed. Consequently, another pulse width modulation signal P2' is generated, the frequency of the pulse width modulation signal P2' is different from the frequency of the pulse width modulation signal P1'. Consequently, the purpose of transmitting different signals in the time-sharing variable-frequency manner can be achieved. It is noted that the way of transmitting different signals in the time-sharing variable-frequency manner is not restricted. For example, in another embodiment, opposite logic values or different counting methods (e.g., the up-counting/down-counting method) may be employed.

Figure 7:
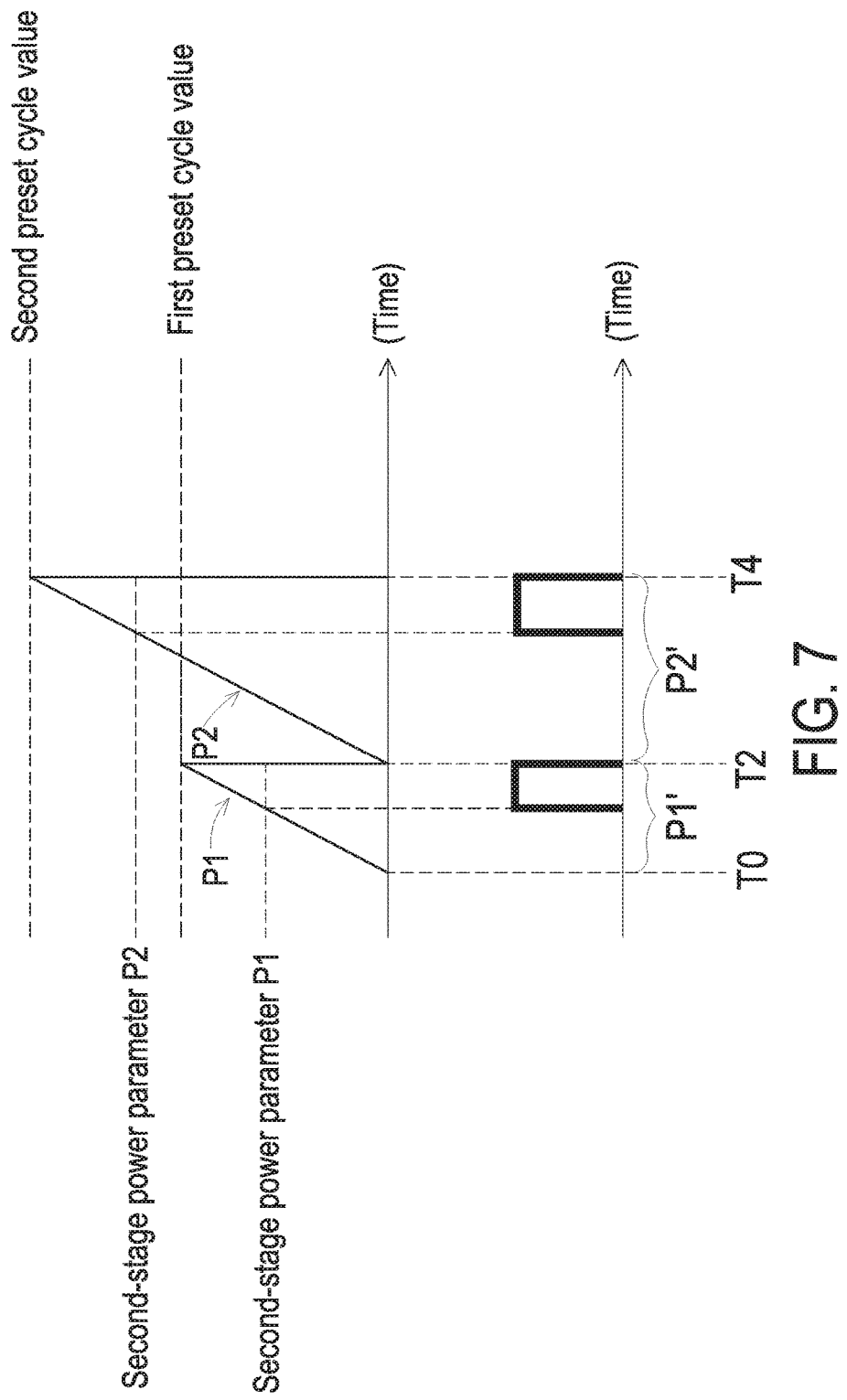
FIG. 7 is a schematic timing waveform diagram illustrating another process of generating the pulse width modulation signal by the pulse width modulator as shown in FIG. 5.

Another method of transmitting different signals in the time-sharing variable-frequency manner will be described as follow. FIG. 7 is a schematic timing waveform diagram illustrating another process of generating the pulse width modulation signal by the pulse width modulator as shown in FIG. 5. In this embodiment, the first register 60 stores different preset cycle values for different sampled signals. However, the frequency of the first clock signal from the phase-locked loop circuit 62 is kept unchanged. That is, the counting speed of the counter in the pulse width modulation signal generator 63 is kept unchanged, but the maximum cycle number is changed. Similarly, the purpose of changing the frequency (or cycle) of the pulse width modulation signal can be achieved by this method. The way of generating the pulse width modulation signal is similar to that of the above embodiment. As shown in FIG. 7, two second-stage power parameters P1 and P2 of the secondary side circuit 31 are sampled by the second-stage analogic sampler 4. In this embodiment, the pulse width modulator 6 is a time-sharing variable-frequency pulse width modulator. The first register 60 stores a first preset cycle value corresponding to the second-stage power parameter P1 or stores a second preset cycle value corresponding to the second-stage power parameter P2. In the first time segment between the time point T0 and the time point T2, the second-stage power parameter P1 is processed by the pulse width modulator 6. Meanwhile, the first preset cycle value is stored in the first register 60, and the second-stage power parameter P1 is stored in the second register 61. The first preset cycle value and the second-stage power parameter P1 are inputted into the pulse width modulation signal generator 63. Consequently, the pulse width modulation signal P1' is generated. In the second time segment between the time point T2 and the time point T4, the second-stage power parameter P2 is processed by the pulse width modulator 6. Meanwhile, the second preset cycle value is stored in the first register 60, and the second-stage power parameter P2 is stored in the second register 61. The second preset cycle value and the second-stage power parameter P2 are inputted into the pulse width modulation signal generator 63. Consequently, the pulse width modulation signal P2' is generated. In this embodiment, the preset cycle value stored in the first register 60 is determined according to the corresponding second-stage power parameter. Consequently, different signals are generated according to the corresponding preset cycle values.

Figure 8:
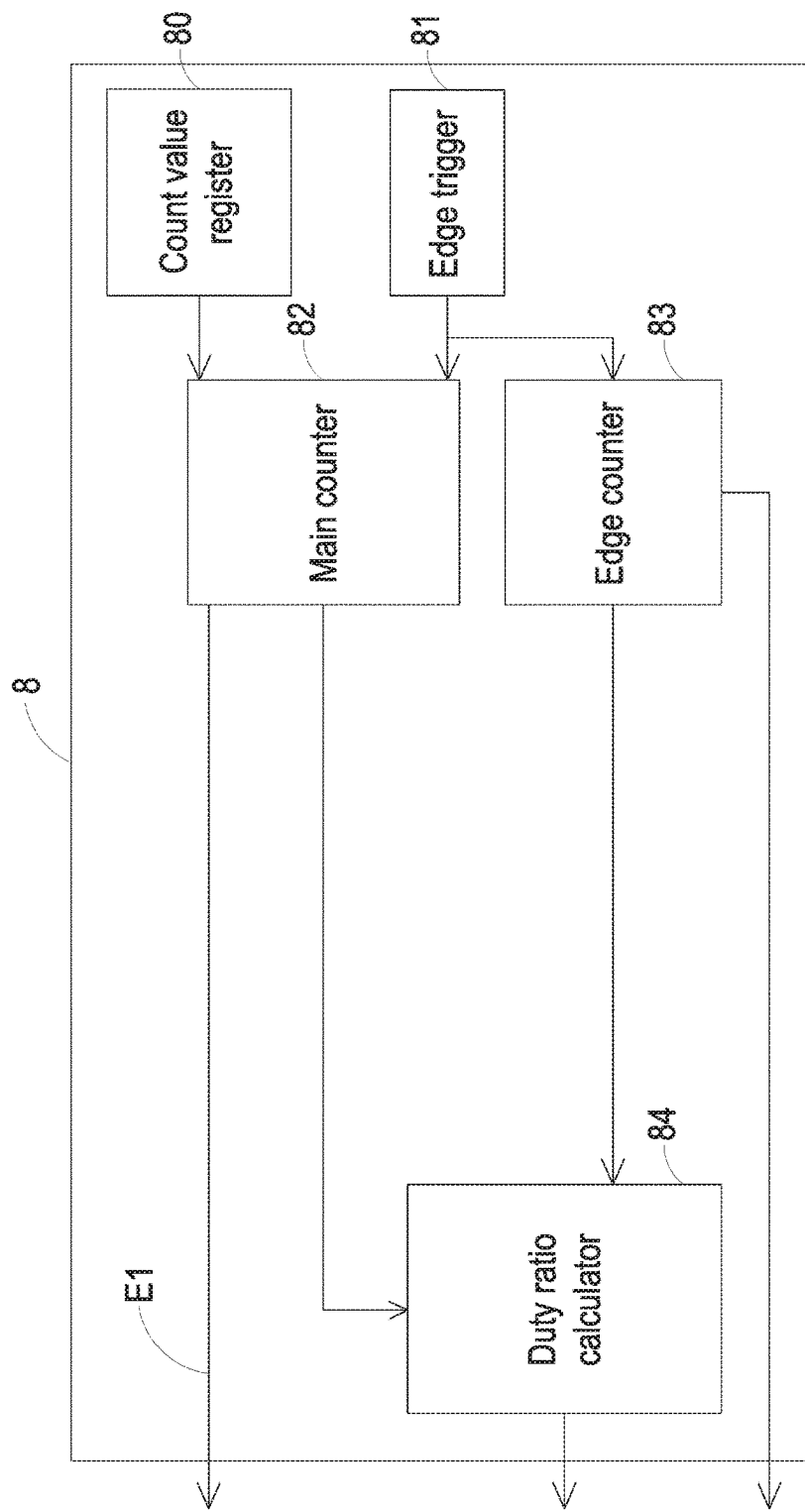
FIG. 8 is a schematic block circuit diagram illustrating the internal circuitry of the pulse width analyzer in the multi-stage power converter of the present disclosure.

FIG. 8 is a schematic block circuit diagram illustrating the internal circuitry of the pulse width analyzer in the multi-stage power converter of the present disclosure. As shown in FIG. 8, the pulse width analyzer 8 comprises a count value register 80, an edge trigger 81, a main counter 82, an edge counter 83 and a duty ratio calculator 84. The count value register 80 stores a preset count value. The edge trigger 81 is connected with the first isolator 7 for receiving the pulse width modulation signal from the first isolator 7. Moreover, the edge trigger 81 generates at least one triggering signal according to the rising edge and the falling edge of each pulse width modulation signal. The main counter 82 is connected with the count value register 80 and the edge trigger 81. Moreover, the main counter 82 stores a second clock frequency, the second clock frequency is different from the first clock frequency. Moreover, the main counter 82 obtains a first count value corresponding to a time period of receiving the triggering signal twice. The counting speed is determined according to the second clock frequency of the main counter 82. The first count value indicates the time period of the pulse width modulation signal in the high level state or the low level state. Moreover, the time period of the pulse width modulation signal in the high level state or the low level state is determined according to the rising information or the falling information of the edge trigger 81. The edge counter 83 is connected with the edge trigger 81. The edge counter 83 generates a second count value according to the number of times the triggering signal is received. The second count value indicates the number of times the pulse width modulation signal is switched between the high level state and the low level state. In other words, the cycle number of the pulse width modulation signal can be realized according to the second count value. The duty ratio calculator 84 is connected with the main counter 82, the edge counter 83 and the control unit 9. The duty ratio calculator 84 acquires a cycle count value and a high level count value of each pulse width modulation signal according to the first count value, the rising information or the falling information of the edge trigger 81 and the second count value. Moreover, the duty ratio calculator 84 calculates a duty ratio of each pulse width modulation signal and thus obtains the second-stage power parameter. The calculation result is transmitted to the control unit 9.

In an embodiment, if the first count value corresponding to the time period of receiving the triggering signal twice is larger than the preset count value of the count value register 80, the main counter 82 generates an error signal E1 in order to prompt the user that the pulse width modulation signal is lost.

In case that the plural pulse width modulation signals with different frequencies are transmitted through the same isolation channel in the time division manner, the control unit 9 can judge the type of the second-stage power parameter corresponding to the received signal. For example, a lookup table (not shown) is previously stored in the control unit 9. The relationships between the frequencies of the pulse width modulation signals corresponding to different second-stage power parameters and the cycle numbers of the pulse width modulation signals to be transmitted in the corresponding time segments are recorded in the lookup table. According to the first count value from the main counter 82 and the second count value from the edge counter, the control unit 9 calculates the frequency of the pulse width modulation signal and the cycle number of the pulse width modulation signal. After the frequency and the cycle number of the pulse width modulation signal are calculated, the control unit 9 judges the type of the second-stage power parameter corresponding to the pulse width modulation signal according to the lookup table. Moreover, the pulse width analyzer 8 calculates the plural second-stage power parameters according to the duty ratios of the pulse width modulation signal and issues the calculating results to the control unit 9. In case that the pulse width modulator 6 generates a single pulse width modulation signal to a single isolation channel, the control unit 9 may calculate the frequency of the pulse width modulation signal only and judges the type of the second-stage power parameter corresponding to the pulse width modulation signal according to the lookup table.

Moreover, due to the tolerance of the circuitry or the electronic components in the multi-stage power converter 1, some problems may occur. For example, if the frequencies of the pulse width modulation signal corresponding to different second-stage power parameters are very close when the pulse width modulation signals with different frequencies are transmitted through the same isolation channel, the control unit 9 cannot accurately judge the type of the second-stage power parameter corresponding to the pulse width modulation signal according to the lookup table. For solving the above problems, the frequencies between the pulse width modulation signals have to satisfy a specified condition. For clarification, two pulse width modulation signals will be taken as an example.

For example, the pulse width modulation signal generator 63 generates a first pulse width modulation signal S1 corresponding to a second-stage power parameter and a second pulse width modulation signal S2 corresponding to another second-stage power parameter. In case that the first pulse width modulation signal S1 is generated, the frequency of the first pulse of the clock signal from the phase-locked loop circuit 62 is f1, the preset cycle number stored in the first register 60 is NA, and the cycle count number outputted from the duty ratio calculator 84 of the pulse width analyzer 8 is NC. In case that the second pulse width modulation signal S2 is generated, the frequency of the first pulse of the clock signal from the phase-locked loop circuit 62 is f2, the preset cycle number stored in the first register 60 is NB, and the cycle count number outputted from the duty ratio calculator 84 of the pulse width analyzer 8 is ND. Moreover, the counting frequency of the main counter 82 in the pulse width analyzer 8 is f3.

The first pulse width modulation signal S1 and the second pulse width modulation signal S2 satisfy the following mathematic formulae:

$$Ts1 = 1/f1 \times NA \tag{1}$$

$$Ts2 = 1/f2 \times NB \tag{2}$$

$$NC = Ts1/(1/f3) \tag{3}$$

$$ND = Ts2/(1/f3) \tag{4}$$

In the above mathematic formulae, Ts1 is the cycle of the first pulse width modulation signal S1, and Ts2 is the cycle of the second pulse width modulation signal S2. If Ts1 is larger than Ts2, NC needs to be larger than ND. That is, the minimum of NC is larger than the maximum of ND. Consequently, the cycle count numbers and the preset cycle number of the first pulse width modulation signal S1 and the second pulse width modulation signal S2 satisfy the following mathematic formulae:

$$NC_{min} = \frac{\frac{1}{f1+\Delta f1} \times NA}{\frac{1}{f3-\Delta f3}} > ND_{max} = \frac{\frac{1}{f2-\Delta f2} \times NB}{\frac{1}{f3+\Delta f3}} \tag{5}$$

$$\frac{f3-\Delta f3}{f1+\Delta f1} \times NA > \frac{f3+\Delta f3}{f2-\Delta f2} \times NB \tag{6}$$

In the above mathematic formulae, $\Delta f1$ is an error value of the frequency f1 of the first pulse width modulation signal S1, $\Delta f2$ is an error value of the frequency f2 of the second pulse width modulation signal S1, and $\Delta f3$ is an error value of the counting frequency f3 of the main counter 82.

In accordance with a feature of the present disclosure, the multi-stage power converter 1 comprises a single control unit 9 in the primary side block. The first-stage power conversion circuit 2 and the second-stage power conversion circuit 3 are controlled by the control unit 9. Consequently, the multi-stage power converter 1 has simplified circuit structure, cost-effectiveness and reduced debugging complexity. Moreover, the multi-stage power converter 1 uses the pulse width modulator 6 to convert the sampled second-stage power parameters into the digital pulse width modulation signals. Consequently, the pulse width modulation signals are transmitted to the pulse width analyzer 8 through the first isolator 7 in a digital manner. The function of the first isolator 7 may be achieved by using a digital isolator. Since it is not necessary to use the linear optocoupler to transmit the feedback signals, the temperature drift effect and the aging problem of the linear optocoupler are avoided. Consequently, the signal transmission is not subjected to distortion and the abnormally operation of multi-stage power converter thus caused is forbidden. Moreover, since the sampled second-stage power parameters are converted into the digital pulse width modulation signals by the pulse width modulator 6 and the pulse width modulation signals are transmitted to the pulse width analyzer 8 through the first isolator 7 in the digital manner, the process of transmitting the second-stage power parameters to the control unit 9 is not interfered by specified factors.

Moreover, the pulse width modulator 6, the pulse width analyzer 8 and the control unit 9 of the multi-stage power converter 1 may be implemented with hardware components or software components according to the practical requirements. In an embodiment, the pulse width analyzer 8 is integrated into the control unit 9. In case that the pulse width analyzer 8 is integrated into the control unit 9, the time-delay of signal transmission is reduced and the multi-stage power converter is controlled more flexibly.

Figure 9:
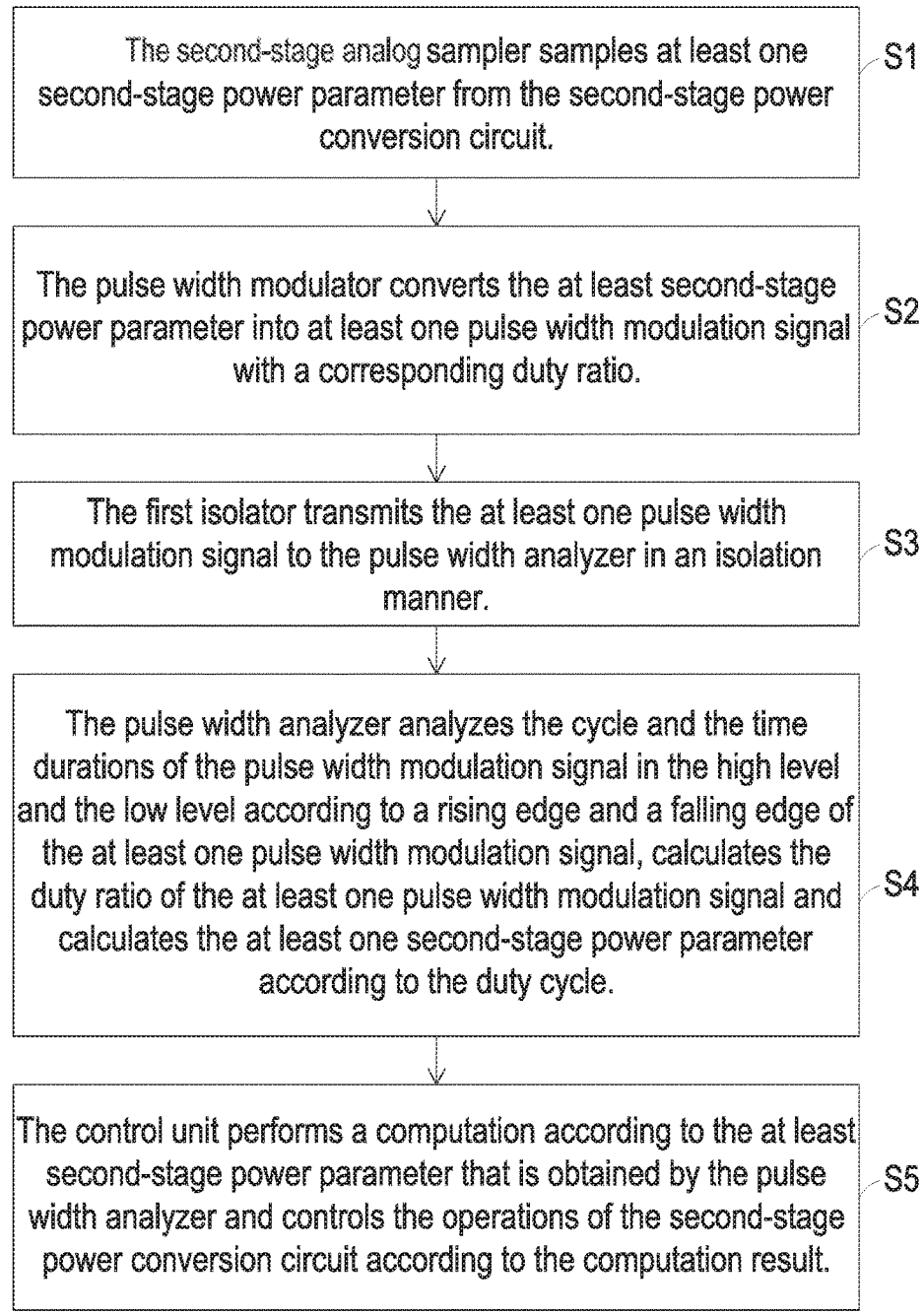
FIG. 9 is a flowchart illustrating a control method of the multi-stage power converter according to an embodiment of the present disclosure.

FIG. 9 is a flowchart illustrating a control method of the multi-stage power converter according to an embodiment of the present disclosure.

In a step S1, the second-stage analogic sampler 4 samples at least one second-stage power parameter from the second-stage power conversion circuit 3.

In a step S2, the pulse width modulator 6 converts the at least one second-stage power parameter into at least one pulse width modulation signal with a corresponding duty ratio.

In a step S3, the first isolator 7 transmits the at least one pulse width modulation signal to the pulse width analyzer 8 in an isolation manner.

In a step S4, the pulse width analyzer 8 analyzes the cycle and the time durations of the pulse width modulation signal in the high level and the low level according to a rising edge and a falling edge of the at least one pulse width modulation signal, calculates the duty ratio of the at least one pulse width modulation signal and calculates the at least one second-stage power parameter according to the duty cycle.

In a step S5, the control unit 9 performs a computation according to the at least one second-stage power parameter that is obtained by the pulse width analyzer 8 and controls the operations of the second-stage power conversion circuit 3 according to the computation result.

In an embodiment, the at least one second-stage power parameter sampled by the second-stage analogic sampler 4 in the step S1 includes plural second-stage power parameters, and the at least one pulse width modulation signal obtained by the pulse width modulator 6 in the step S2 includes plural pulse width modulation signals.

In an embodiment, first register 60 stores a preset cycle value. In addition, the step S2 comprises the following sub-steps. In a first sub-step, a preset cycle value is stored in the first register 60. In a second sub-step, the plural second-stage power parameters are stored in the second register 61. In a third sub-step, the phase-locked loop circuit 62 provides a clock signal with a first clock frequency. In a fourth sub-step, the pulse width modulation signal generator 63 up-counts by 1 from zero to the preset cycle value according to the first clock frequency, and generates the corresponding pulse width modulation signal according to a result of comparing the second-stage power parameter of the second register with a current count value. The maximum count value of the counter of the pulse width modulation signal generator 63 is limited by the preset cycle value of the first register 60.

In an embodiment, first register 60 stores plural preset cycle values. In addition, the step S2 comprises the following sub-steps. In a first sub-step, plural preset cycle values corresponding to the plural second-stage power parameters are stored in the first register 60. In a second sub-step, the plural second-stage power parameters are stored in the second register 61. In a third sub-step, the phase-locked loop circuit 62 provides a clock signal with a first clock frequency. In a fourth sub-step, the pulse width modulation signal generator 63 up-counts by 1 from zero to the corresponding preset cycle value according to the first clock frequency, and generates the corresponding pulse width modulation signal according to a result of comparing the second-stage power parameter of the second register with a current count value. The maximum count value of the counter of the pulse width modulation signal generator 63 is limited by the corresponding preset cycle value of the first register 60.

Moreover, the step S4 comprises the following sub-steps. In a first sub-step, a preset count value is stored in the count value register 80. In a second sub-step, the edge trigger 81 generates a triggering signal according to a rising edge and a falling edge of each pulse width modulation signal. The triggering signal may be used to judge the high level or the low level of the pulse width modulation signal. In a third sub-step, the main counter 82 obtains a first count value corresponding to a time period of receiving the triggering signal twice. The counting speed is determined according to the second clock frequency of the main counter 82. In a fourth sub-step, the edge counter 83 generates a second count value according to the number of times the triggering signal is received. In a fifth sub-step, the duty ratio calculator 84 acquires a cycle count value and a high level count value of each pulse width modulation signal according to the first count value, the rising information or the falling information of the edge trigger 81 and the second count value. Moreover, the duty ratio calculator 84 calculates a duty ratio of each pulse width modulation signal and thus obtains the second-stage power parameter. Alternatively, in the third sub-step, if the first count value corresponding to the time period of receiving the triggering signal twice is larger than the preset count value, the main counter 82 generates an error signal E1 in order to prompt the user that the pulse width modulation signal is lost.

From the above descriptions, the present disclosure provides a multi-stage power converter. The multi-stage power converter is equipped with a single control unit. Moreover, the sampled second-stage power parameters are converted into digital pulse width modulation signal by the pulse width modulator. Consequently, the pulse width modulation signal is transmitted to the pulse width analyzer through the first isolator. Consequently, the multi-stage power converter of the present disclosure has simplified circuit structure and reduced debugging complexity.

While the disclosure has been described in terms of what is presently considered to be the most practical and preferred embodiments, it is to be understood that the disclosure needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A multi-stage power converter, comprising:
   a first-stage power conversion circuit;
   a second-stage power conversion circuit comprising a transformer, a primary side circuit and a secondary side circuit, wherein the primary side circuit is connected between the first-stage power conversion circuit and a primary winding of the transformer, and the secondary side circuit is connected with a secondary winding of the transformer;
   a second-stage analog sampler connected with the secondary side circuit for sampling at least one second-stage power parameter from the secondary side circuit;
   a pulse width modulator for receiving a sampling result from the second-stage analog sampler and converting the at least one second-stage power parameter into at least one pulse width modulation signal with at least one corresponding duty ratio;
   a first isolator connected with the pulse width modulator for receiving the at least one pulse width modulation signal;
   a pulse width analyzer connected with the first isolator, wherein the pulse width analyzer receives the at least one pulse width modulation signal through the first isolator in an isolation manner, calculates the duty ratio of the at least one pulse width modulation signal according to a rising edge and a falling edge of the at least one pulse width modulation signal, and calculates the at least one second-stage power parameter according to the duty ratio;
   a control unit connected with the first-stage power conversion circuit, the primary side circuit and the pulse width analyzer, wherein the control unit controls operations of the first-stage power conversion circuit, and controls operations of the primary side circuit according to the at least one second-stage power parameter that is obtained by the pulse width analyzer;
   a second isolator, wherein the second isolator is connected between the control unit and the secondary side circuit, wherein the control unit generates a control signal according to the at least one second-stage power parameter that is obtained by the pulse width analyzer, and transmits the control signal to the secondary side circuit through the second isolator so as to control operations of the secondary side circuit; and an analog-digital converter connected between the second-stage analog sampler and the pulse width modulator, wherein after the at least one second-stage power parameter is sampled by the second-stage analog sampler, the at least one sampled second-stage power parameter is converted into a digital signal by the analog-digital converter and the digital signal is transmitted to the pulse width modulator.

2. The multi-stage power converter according to claim 1, wherein the multi-stage power converter is included in a vehicle charging system.

3. The multi-stage power converter according to claim 1, further comprising a first-stage analog sampler, wherein the first-stage analog sampler is connected with the first-stage power conversion circuit and the control unit for sampling at least one first-stage power parameter from the first-stage power conversion circuit and issues a sampling result to the control unit, wherein the control unit controls operations of the first-stage power conversion circuit according to the sampling result of the first-stage analog sampler.

4. The multi-stage power converter according to claim 1, wherein the at least one second-stage power parameter sampled by the second-stage analog sampler includes plural second-stage power parameters, and the at least one pulse width modulation signal obtained by the pulse width modulator includes plural pulse width modulation signals, wherein the first isolator comprises plural isolation channels between the pulse width modulator and the pulse width analyzer, and the plural pulse width modulation signals are transmitted from the pulse width modulator to the pulse width analyzer through the corresponding isolation channels.

5. The multi-stage power converter according to claim 4, wherein the pulse width modulator is a fixed-frequency pulse width modulator.

6. The multi-stage power converter according to claim 4, wherein the pulse width modulator is a variable-frequency pulse width modulator.

7. The multi-stage power converter according to claim 1, wherein the at least one second-stage power parameter sampled by the second-stage analog sampler includes plural second-stage power parameters, and the at least one pulse width modulation signal obtained by the pulse width modulator includes plural pulse width modulation signals that are generated in a time division manner, wherein the first isolator comprises a single isolation channel, and the pulse width modulation signals with different frequencies are transmitted from the pulse width modulator to the isolation channel in a time division manner, wherein the plural pulse width modulation signals have fixed or variable cycle numbers.

8. The multi-stage power converter according to claim 7, further comprising a sequence controller, wherein the sequence controller is connected with the pulse width modulator for controlling sequences and frequencies of the plural pulse width modulation signals that are transmitted from the pulse width modulator to the first isolator in a time-interleaving manner.

9. The multi-stage power converter according to claim 7, wherein the pulse width modulator comprises:

a first register storing a preset cycle value;
a second register storing the plural second-stage power parameters;

a phase-locked loop circuit for generating a clock signal with a first clock frequency, wherein the first clock frequency is adjustable; and a pulse width modulation signal generator connected with the first register, the second register and the phase-locked loop circuit, wherein the pulse width modulation signal generator receives the preset cycle value and the plural second-stage power parameters, up-counts by 1 from zero to the preset cycle value, and generates the corresponding pulse width modulation signal according to a result of comparing the second-stage power parameter of the second register with a current count value.

10. The multi-stage power converter according to claim 9, wherein the pulse width analyzer comprises:

a count value register storing a preset count value;
an edge trigger connected with the first isolator for receiving the plural pulse width modulation signals from the first isolator and generating a triggering signal according to a rising edge and a falling edge of each pulse width modulation signal;
a main counter connected with the count value register and the edge trigger, and storing a second clock frequency, wherein the main counter obtains a first count value corresponding to a time period of receiving the triggering signal twice;
an edge counter connected with the edge trigger and the control unit, wherein the edge counter generates a second count value according to a number of times the triggering signal is received; and
a duty ratio calculator connected with the main counter and the edge counter, wherein the duty ratio calculator acquires a cycle count value and a high level count value of each pulse width modulation signal according to the first count value, a rising information or a falling information of the edge trigger and the second count value, and calculates a duty ratio of each pulse width modulation signal, so that each second-stage power parameter is obtained.

11. The multi-stage power converter according to claim 10, wherein if the first count value corresponding to the time period of receiving the triggering signal twice is larger than the preset count value, the main counter generates an error signal.

12. The multi-stage power converter according to claim 10, wherein a lookup table is previously stored in the control unit, and the lookup table records relationships between frequencies of the pulse width modulation signals corresponding to different second-stage power parameters and cycle numbers of the pulse width modulation signals to be transmitted in the corresponding time segments, wherein after the frequency and the cycle number of each pulse width modulation signal are calculated by the control unit according to the first count value and the second count value, the control unit judges a type of each second-stage power parameter corresponding to the pulse width modulation signal according to the lookup table.

13. The multi-stage power converter according to claim 10, wherein the second clock frequency is different from the first clock frequency.

14. The multi-stage power converter according to claim 10, wherein the pulse width modulation signal generator generates a first pulse width modulation signal and a second pulse width modulation signal of the plural pulse width modulation signals with the corresponding duty cycles, and the first pulse width modulation signal and the second pulse width modulation signal satisfy mathematic formula:

$$\frac{f3 - \Delta f3}{f1 + \Delta f1} \times NA > \frac{f3 + \Delta f3}{f2 - \Delta f2} \times NB$$

where, NA is the preset cycle number stored in the first register when the first pulse width modulation signal is generated, f1 is a frequency of the first pulse of the clock signal from the phase-locked loop circuit when the first pulse width modulation signal is generated, NB is the preset cycle number stored in the first register when the second pulse width modulation signal is generated, f2 is a frequency of the first pulse of the clock signal from the phase-locked loop circuit when the second pulse width modulation signal is generated, f3 is a counting frequency of the main counter in the pulse width analyzer, $\Delta f1$ is an error value of the frequency f1, $\Delta f2$ is an error value of the frequency f2, and $\Delta f3$ is an error value of the counting frequency f3.

15. The multi-stage power converter according to claim 7, wherein the pulse width modulator comprises:
a first register storing plural preset cycle values;
a second register storing the plural second-stage power parameters;
a phase-locked loop circuit for generating a clock signal with a first clock frequency, wherein the first clock frequency is adjusted according to the second-stage power parameters; and
a pulse width modulation signal generator connected with the first register, the second register and the phase-locked loop circuit, wherein the pulse width modulation signal generator receives the preset cycle values and the plural second-stage power parameters, up-counts by 1 from zero to the corresponding preset cycle value, and generates the corresponding pulse width modulation signal according to a result of comparing the second-stage power parameter of the second register with a current count value.

16. The multi-stage power converter according to claim 1, wherein a frequency of the at least one pulse width modulation signal is equal to a control frequency of the multi-stage power converter.

17. The multi-stage power converter according to claim 1, wherein the control unit is the only controller of the multi-stage power converter.

18. A control method of a multi-stage power converter, the multi-stage power converter comprising a first-stage power conversion circuit, a second-stage power conversion circuit, a second-stage analog sampler, a pulse width modulator, a first isolator, a pulse width analyzer, a second isolator, an analog-digital converter and a control unit, the second-stage power conversion circuit being connected with an output terminal of the first-stage power conversion circuit and comprising a transformer, the second isolator being connected between the control unit and a secondary side circuit of the second-stage power conversion circuit, the analog-digital converter is connected between the second-stage analog sampler and the pulse width modulator, and the control unit generating a control signal according to the at least one second-stage power parameter that is obtained by the pulse width analyzer and transmitting the control signal to the secondary side circuit through the second isolator so as to control operations of the secondary side circuit, the control method comprising steps of:
(a) sampling at least one second-stage power parameter from the second-stage power conversion circuit by the second-stage analog sampler, wherein after the at least one second-stage power parameter is sampled by the second-stage analog sampler, the at least one sampled second-stage power parameter is converted into a digital signal by the analog-digital converter and the digital signal is transmitted to the pulse width modulator;
(b) converting the digital signal into at least one pulse width modulation signal with a corresponding duty ratio by the pulse width modulator;
(c) transmitting the at least one pulse width modulation signal from the first isolator to the pulse width analyzer in an isolation manner;
(d) the pulse width analyzer calculating the duty ratio of the at least one pulse width modulation signal according to a rising edge and a falling edge of the at least one pulse width modulation signal and calculating the at least one second-stage power parameter according to the duty cycle; and
(e) the control unit performing a computation according to the at least one second-stage power parameter from the pulse width analyzer and controlling the operations of the second-stage power conversion circuit according to a result of the computation.

19. The control method according to claim 18, wherein the at least one second-stage power parameter sampled in the step (a) includes plural second-stage power parameters, and the at least one pulse width modulation signal obtained in the step (b) includes plural pulse width modulation signals.

20. The control method according to claim 19, wherein in the step (c), the plural pulse width modulation signals have fixed or variable cycle numbers, and the plural pulse width modulation signals with different frequencies are transmitted from the pulse width modulator to the pulse width analyzer through a single isolation channel of the first isolator in a time division manner.

21. The control method according to claim 20, wherein the step (b) comprises sub-steps of:
(b1) storing a preset cycle value;
(b2) storing the plural second-stage power parameters;
(b3) providing a clock signal with a first clock frequency; and
(b4) up-counting by 1 from zero to the preset cycle value according to the first clock frequency, and generating the corresponding pulse width modulation signal according to a result of comparing the second-stage power parameter of the second register with a current count value.

22. The control method according to claim 21, wherein in the step (b4), the maximum count value is limited by the preset cycle value.

23. The control method according to claim 20, wherein the step (b) comprises sub-steps of:
(b1) storing plural preset cycle values corresponding to the plural second-stage power parameters;
(b2) storing the plural second-stage power parameters;
(b3) providing a clock signal with a first clock frequency; and
(b4) up-counting by 1 from zero to the corresponding preset cycle value according to the first clock frequency, and generating the corresponding pulse width modulation signal according to a result of comparing the second-stage power parameter of the second register with a current count value.

24. The control method according to claim 23, wherein in the step (b4), the maximum count value is limited by the corresponding preset cycle value.

25. The control method according to claim 18, wherein the step (d) comprises sub-steps of:
- (d1) storing a preset count value;
- (d2) generating a triggering signal according to a rising edge and a falling edge of each pulse width modulation signal;
- (d3) obtaining a first count value corresponding to a time period of receiving the triggering signal twice;
- (d4) generating a second count value according to a number of times the triggering signal is received; and
- (d5) calculating a duty ratio of each pulse width modulation signal of each pulse width modulation signal according to the first count value, a rising information, a falling information and the second count value, and calculating each second-stage power parameter according to the duty cycle.

26. The control method according to claim 25, wherein if the first count value corresponding to the time period of receiving the triggering signal twice is larger than the preset count value, the main counter generates an error signal.

27. The control method according to claim 25, wherein the at least one second-stage power parameter sampled in the step (a) includes plural second-stage power parameters, wherein in the step (d5), the duty cycle, a frequency and a cycle count value of each pulse width modulation signal are acquired according to the first count value, a rising information, a falling information and the second count value, a type of the second-stage power parameter corresponding to each pulse width modulation signal is judged according to the frequency and the cycle count value of each pulse width modulation signal, and the second-stage power parameter is calculated according to the duty cycle.

* * * * *